United States Patent
Rim

(10) Patent No.: US 7,034,362 B2
(45) Date of Patent: Apr. 25, 2006

(54) DOUBLE SILICON-ON-INSULATOR (SOI) METAL OXIDE SEMICONDUCTOR FIELD EFFECT TRANSISTOR (MOSFET) STRUCTURES

(75) Inventor: Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 10/688,692

(22) Filed: Oct. 17, 2003

(65) Prior Publication Data

US 2005/0082531 A1    Apr. 21, 2005

(51) Int. Cl.
*H01L 27/12* (2006.01)

(52) U.S. Cl. ............... 257/351; 257/347; 257/623; 257/627

(58) Field of Classification Search ........... 257/347, 257/350–354, 618, 623, 627
See application file for complete search history.

(56) References Cited

U.S. PATENT DOCUMENTS

| | | | | |
|---|---|---|---|---|
| 4,933,298 | A | * | 6/1990 | Hasegawa ............... 438/150 |
| 5,081,062 | A | * | 1/1992 | Vasudev et al. ........... 438/412 |
| 5,482,871 | A | * | 1/1996 | Pollack ................... 438/151 |
| 5,847,419 | A | * | 12/1998 | Imai et al. ............... 257/192 |
| 6,288,427 | B1 | * | 9/2001 | Huang ..................... 257/350 |
| 6,424,020 | B1 | * | 7/2002 | Vu et al. ................. 257/507 |
| 6,429,488 | B1 | * | 8/2002 | Leobandung et al. ....... 257/354 |
| 6,469,350 | B1 | * | 10/2002 | Clark et al. .............. 257/349 |
| 6,593,624 | B1 | * | 7/2003 | Walker ................... 257/344 |
| 6,624,476 | B1 | * | 9/2003 | Chan et al. ............... 257/347 |
| 6,670,716 | B1 | * | 12/2003 | Christensen et al. ....... 257/762 |
| 6,855,976 | B1 | * | 2/2005 | Nagano et al. ............ 257/305 |

* cited by examiner

*Primary Examiner*—Allan R. Wilson
(74) *Attorney, Agent, or Firm*—Scully, Scott, Murphy & Presser, P.C.; Wan Yee Cheung

(57) ABSTRACT

A SOI MOSFET structure having a reduced step height between the various semiconductor layers without adversely affecting the junction capacitance of the semiconductor device formed on the uppermost semiconductor layer as well as a method of fabricating the same are provided. The structure of the present invention includes an elevated device region having at least one semiconductor device located on a second semiconductor layer. The elevated device region further includes a source/drain junction that extends from the second semiconductor layer down to a first buried insulator layer that is located on an upper surface of the semiconductor substrate. The structure also includes a recessed device region having at least one semiconductor device located atop a first semiconductor layer which is located on an upper surface of the first buried insulator. An isolation region separates the elevated device region from the recessed device region.

9 Claims, 11 Drawing Sheets

DOUBLE SILICON-ON-INSULATOR (SOI) METAL OXIDE SEMICONDUCTOR FIELD EFFECT TRANSISTOR (MOSFET) STRUCTURES

FIELD OF THE INVENTION

The present invention relates to a semiconductor device and a method of fabricating the same, and more particularly to a double silicon-on-insulator (SOI) metal oxide semiconductor field effect transistor (MOSFET) structure and a method of fabricating such a structure.

BACKGROUND OF THE INVENTION

In the semiconductor industry, it is known to form nFETs and pFETs on semiconductor substrates that contain various heterolayers. Such technology is described, for example, in A. Sadek, et al. "Design of Si/SiGe Heterojunction Complementary Metal-Oxide-Semiconductor Transistors", Electron Devices, IEEE Transactions, Vol. 43, Issue 8, August 1996, pp. 1224–1232. Specifically, an optimized Si/SiGe heterostructure for CMOS transistor operation is provided in the A. Sadek, et al. article which has a planar design and avoids inversion of the Si layer at the oxide interface.

In such technology, the basic idea is to form a plurality of layers in a single structure, and then fabricate nFET and pFET channels in their respectively optimal material layer. For example, tensile-strained Si for nFETs and compressive-strained SiGe for pFETs. This is usually achieved in the prior art by either etching away unnecessary layers in selective areas, or by growing layers in selective areas.

One evolution of the foregoing is to fabricate a structure that consists of multiple semiconductor layers and insulator layers such as semiconductor layer 2/insulator 2/semiconductor 1/insulator 1/substrate. Some devices, e.g., nFETs, pFETs or a combination thereof, can be fabricated in semiconductor layer 1, while other devices can be fabricated in semiconductor layer 2. Since both semiconductor layers are located on an insulator, the devices formed thereon will be SOI FETs.

One problem with the foregoing approaches is that there exists a step region (consisting of the various semiconductor layers) between the different types of device structures. This is especially prevalent in the semiconductor/insulator/semiconductor structure where it is preferred that the insulator layers be at least several hundred Angstroms thick.

The foregoing thickness requirement is needed to provide devices that have minimal junction capacitance. Hence, a tradeoff exists between the junction capacitance and the step height between different types of semiconductor devices. For instance, in a structure that consists of semiconductor 2, insulator 2, semiconductor 1, and insulator 1 layers stacked in order, the junction capacitance of the FETs fabricated on the semiconductor 2 is strongly influenced by the thickness of the insulator 2 layer. In order to minimize the junction capacitance and to realize higher circuit speed, the insulator 2 layer needs to be thick. On the other hand, the thickness of the insulator 2 layer adds to the step height between semiconductor 1 and semiconductor 2. For optimal integration of high density circuits, this step height (and thus the thickness of the insulator 2 layer) needs to be as small as possible.

There is thus a need for providing a semiconductor structure in which SOI MOSFETs are formed on a plurality of semiconductor layers such that the step height between the various devices is substantially reduced, without penalizing the junction capacitance of the device fabricated on the upper semiconductor layer.

SUMMARY OF THE INVENTION

The present invention provides a structure and method that achieves SOI MOSFETs formed on a plurality of semiconductor layers (with independently selected material and thickness) all integrated in a single substrate. The structure of the present invention also allows for a thin insulator (thus reduced step height) between the semiconductor layers without penalizing the junction capacitance of the device to be fabricated on the upper semiconductor layer.

In broad terms, the structure of the present invention comprises:

an elevated device region having at least one semiconductor device located on a second semiconductor layer, wherein said elevated device region further comprises a source/drain junction which extends from the second semiconductor layer down to a first buried insulator layer that is located on an upper surface of a semiconductor substrate, said first buried insulator is separated from the second semiconductor layer by a first semiconductor layer and a second buried insulator layer;

a recessed device region having at least one semiconductor device located atop a first semiconductor layer which is located on an upper surface of the first buried insulator; and an isolation region separating said elevated device region from said recessed device region.

In one embodiment of the present invention, the elevated device region includes a merged source/drain region that is self-aligned to an edge of an isolation region and a spacer of the device located in the elevated device region.

In another embodiment of the present invention, the elevated device region includes a merged source/drain region that is not self-aligned to an edge of an isolation region and a spacer of the device located in the elevated device region.

Another aspect of the present invention relates to a method of fabricating the aforementioned structure. Specifically, and in broad terms, the method of the present invention comprises the steps of:

providing a structure comprising an elevated device region and a recessed device region that are separated from each other by an isolation region, said elevated device region comprising a first insulator layer located on a substrate, a first semiconductor layer located on the first insulating layer, a second insulator layer located on the first semiconductor layer, and a second semiconductor layer located on the second insulator layer, and said recessed device region comprising said first buried insulator and said first semiconductor layer;

forming semiconductor devices in said elevated device region and said recessed device region, wherein the semiconductor device in the elevated device region is formed on the second semiconductor layer and the device in the recessed device region is formed on the first semiconductor layer;

forming merged source/drain regions in said elevated device region that lay on the first semiconductor layer; and forming junctions in the elevated and recessed device regions, said junction in the recessed device region extends from an upper surface of the second semiconductor layer down to the first buried insulator layer.

DETAILED DESCRIPTION OF THE INVENTION

Figure 1:
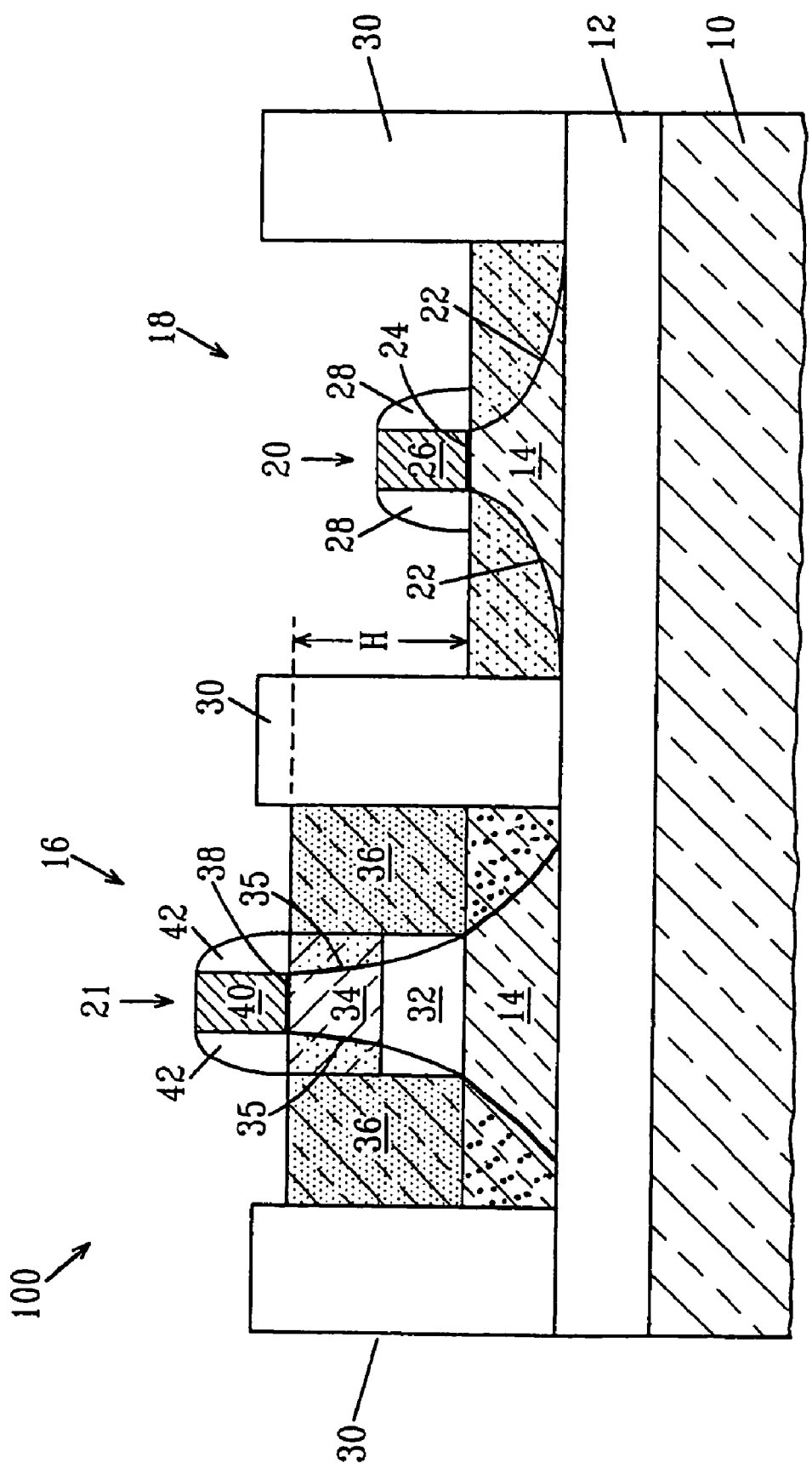
FIG. 1 is a pictorial representation (through a cross sectional view) illustrating a double SOI MOSFET structure of the present invention.

The present invention, which provides a double SOI MOSFET structure having a reduced step height between the various semiconductor layers, while not adversely affecting the junction capacitance of the semiconductor device located on the upper semiconductor layer, will now be described in greater detail by referring to the drawings that accompany the present application.

Figure 2:
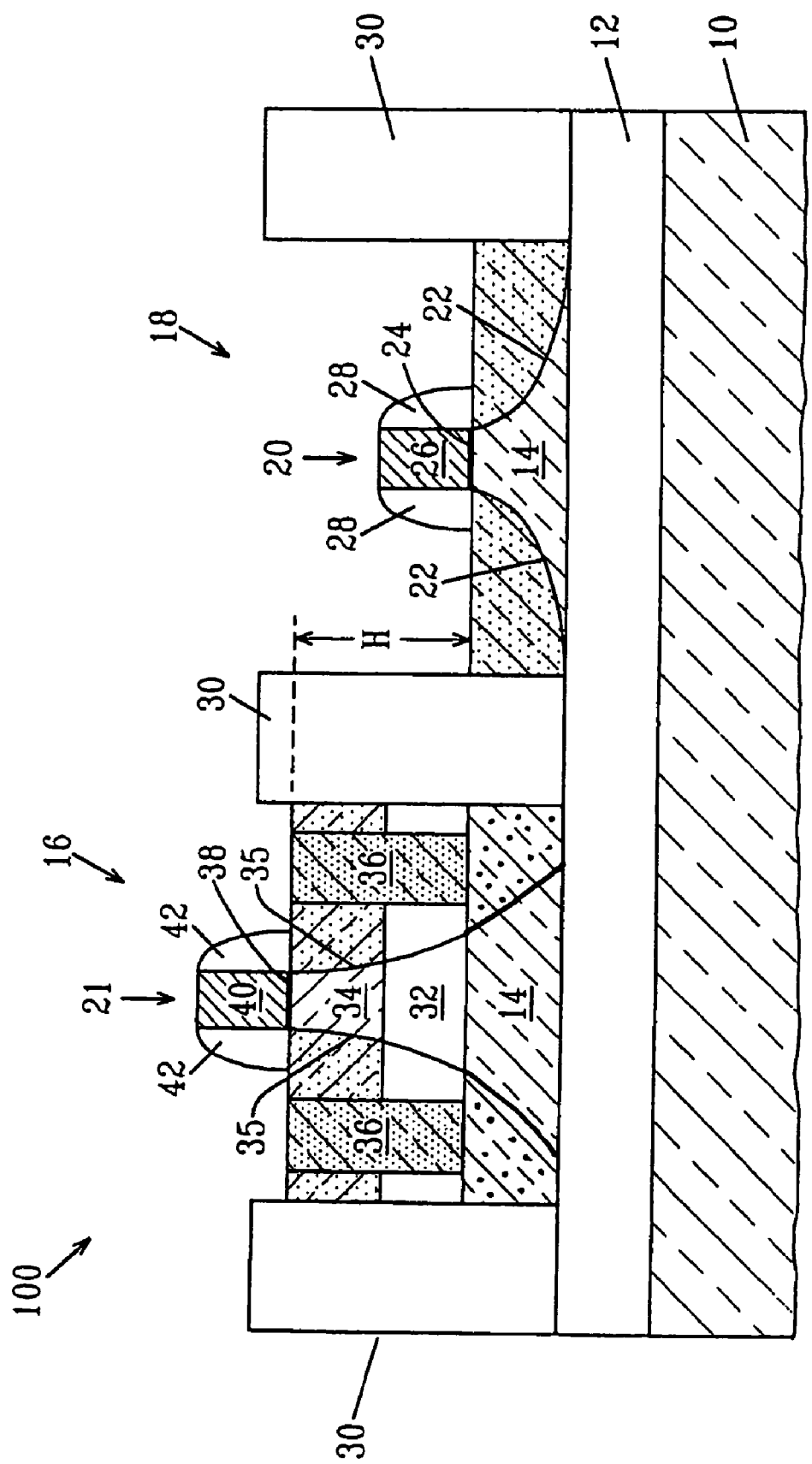
FIG. 2 is a pictorial representation (through a cross sectional view) illustrating another double SOI MOSFET structure of the present invention.

FIGS. 1 and 2 show cross sectional views of the double SOI MOSFET structure 100 of the present invention. Specifically, the double SOI MOSFET structure 100 of the present invention comprises semiconductor substrate 10, first buried insulating layer 12 located on an upper surface of the semiconductor substrate 10, first semiconductor layer 14 located on an upper surface of a portion of the first buried insulator layer 12, elevated device region 16 and recessed (relative to the elevated device region 16) device region 18. As shown, the recessed device region 18 is located directly on top of the first semiconductor layer 14. The recessed device region 18 includes a FET (n- or p-type) 20 which comprises junction regions 22 located in the first semiconductor layer 14, a gate dielectric 24 located on a surface portion of the first semiconductor layer 14, gate conductor 26 located on the gate dielectric 24, and spacers 28 that are located on at least the sidewalls of the gate conductor 26.

The elevated device region 16, which is separated from the recessed device region 18 by an isolation region 30, includes a second buried insulator layer 32 located on a surface portion of the first semiconductor layer 14, a second semiconductor layer 34 located on the second buried insulator layer 32, junctions 35 located in the second semiconductor layer 34, the second buried insulator layer 32 and the first semiconductor layer 14, and merged S/D regions 36 that are self-aligned to the spacers 42 of the FET 21 located in the elevated device region 16. FIG. 2 shows an embodiment of the present invention in which the merged S/D regions 36 are not self-aligned to the spacers 42 of the FET 21 located in the elevated device region 16.

The elevated device region 16 includes FET (either n- or p-type) 21 that comprises gate dielectric 38 located on a surface portion of the second semiconductor layer 34, gate conductor 40 located on the gate dielectric 38, and spacers 42 that are located on at least the sidewalls of the gate conductor 40.

By utilizing a layer transfer technique, to be described in greater detail below, the choice of material (e.g., element, strain state, crystal orientation, and layer structure, i.e., homogeneous or heterogeneous) and thickness of the first semiconductor layer 14 and the second semiconductor layer 34 can be independently made. Additionally, the layer transfer technique also allows for independent choice of thickness for first buried insulator layer 12 and the second buried insulator layer 32.

In the structures shown in FIGS. 1 and 2, the first semiconductor layer 14 is in electrical contact with the second semiconductor layer 34. This means that the source/drain junction of the elevated device is in contact with the first buried insulator layer 12. Hence, the capacitance seen at this node will be across the first buried insulator layer 12, not the second buried insulator layer 32. This decouples the junction capacitance of the elevated device from the thickness of the second buried insulator layer 32 allowing lower junction capacitance in the elevated device region 16. Moreover, this allows for utilizing a thin second buried insulator layer 32 such that the step height H between the elevated device and the recessed device can be substantially reduced. The step height H denotes the distance between the upper surfaces of each semiconductor layer in which a device is fabricated upon. In the drawings, the step height H is the distance between the upper surface of the second semiconductor layer 34 and the upper surface of the first semiconductor layer 14.

Figure 3A:
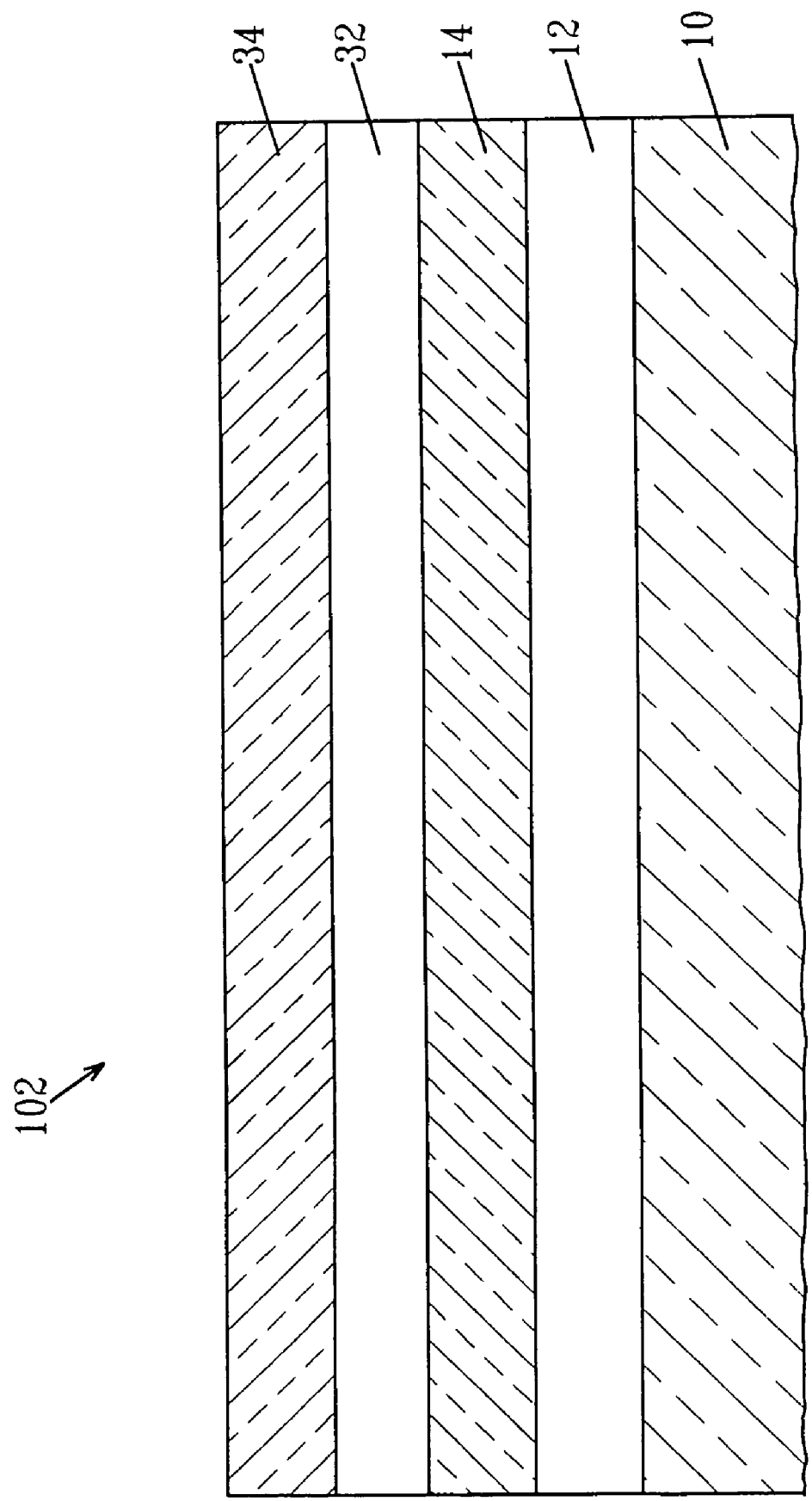
FIGS. 3A–3E are pictorial representations (through cross sectional views) illustrating the basic processing steps of the present invention which can be used to form the structure shown in FIG. 1.

The process employed in the present invention for fabricating the double SOI MOSFET structures shown in FIGS. 1 and 2 will now be described in greater detail. Reference is first made to FIG. 3A which shows an initial structure 102 that can be employed in the present invention. The initial structure 102 includes semiconductor substrate 10, first buried insulator layer 12, first semiconductor layer 14, second buried insulator layer 32 and second semiconductor layer 34.

The initial structure 102 shown in FIG. 3A can be fabricated using conventional procedures well known to those skilled in the art. For example, a layer transfer process can be used in which wafer bonding is employed. In the layer transfer process, two semiconductor wafers are bonded together. The two wafers used in fabricating the initial structure 102 may include two SOI wafers, wherein one of the wafers includes the first buried insulator layer 12 and the first semiconductor layer 14 and the other wafer includes the second insulator layer 32 and the second semiconductor layer 34; an SOI wafer and a bulk semiconductor wafer; two bulk semiconductor wafers; or an SOI wafer and a bulk wafer which includes an ion implant region such as a $H_2$ implant region which can be used to split a portion of at least one of the wafers during bonding.

Bonding is achieved by first bringing the two wafers into intimate contact with other; optionally applying an external force to the contacted wafers; and then heating the two contacted wafers under conditions that are capable of bonding the two wafers together. The heating step may be performed in the presence or absence of an external force. The heating step is typically performed in an inert ambient at a temperature from about 200° to about 1050° C. for a time period from about 2 to about 20 hours. More preferably, the bonding is performed at a temperature from about 200° to about 400° C. for a time period from about 2 to about 20 hours. The term "inert ambient" is used in the present invention to denote an atmosphere in which an inert gas, such as He, Ar, $N_2$, Xe, Kr or a mixture thereof, is employed. One preferred ambient used during the bonding process is $N_2$.

In the embodiment where two SOI wafers are employed, some material layers of at least one of the SOI wafers may be removed after bonding utilizing a planarization process such as chemical mechanical polishing (CMP) or grinding and etching.

In the embodiment in which one of the wafers includes an ion implant region, the ion implant region forms a porous region during bonding which causes a portion of the wafer above the ion implant region to break off leaving a bonded wafer. The implant region is typically comprised of $H_2$ ions which are implanted into the surface of the wafer utilizing ion implantation conditions that are well known to those skilled in the art.

The semiconductor substrate 10 of the initial structure 102 comprises any semiconductor material known to those skilled in the art. Illustrative examples of semiconductor materials that can be employed as the substrate 10 include, but are not limited to: Si, SiC, SiGe, SiGeC, Ge alloys, GaAs, InAs, InP as well as other III/V or II/VI compound semiconductors. The thickness of the substrate 10 is inconsequential to the present invention.

The first buried insulator layer 12 is an oxide, nitride, oxynitride or other dielectric material. In a preferred embodiment of the present invention, the first buried insulating layer 12 is an oxide. The thickness of the first buried insulator layer 12 may vary depending on the origin of the layer. Typically, however, the first buried insulator layer 12 has a thickness from about 5 to about 500 nm, with a thickness from about 50 to about 200 nm being more highly preferred.

The first semiconductor layer 14 is comprised of any semiconducting material including, for example, Si, SiC, SiGe, SiGeC, Ge alloys, GaAs, InAs, inP as well as other III/V or II/VI compound semiconductors. First semiconductor layer 14 may comprise a homogeneous material including one of the same elements mentioned above, or layer 14 may be a heterogeneous structure in which at least two different elements mentioned above are stacked on top of each other. The first semiconductor layer 14 can have any known crystal orientation including, for example, (100), (110), (111) and the like. The first semiconductor layer 14 may be unstrained, strained or a combination of strained and unstrained.

The thickness of the first semiconductor layer 14 may vary depending on the initial starting wafers used to form the structure 102. Typically, however, the first semiconductor layer 14 has a thickness from about 2 to about 300 nm, with a thickness from about 5 to about 150 nm being more highly preferred.

The second buried insulator layer 32, which is located between the first semiconductor layer 14 and the second semiconductor layer 34 has a variable thickness depending upon the initial wafers used to create the structure 102. Typically, however, the second buried insulator 32 has a thickness from about 2 to about 500 nm, with a thickness from about 5 to about 50 nm being more highly preferred. The second buried insulator layer 32 may be composed of one of the dielectrics mentioned above. The second buried insulator layer 32 can be comprised of the same dielectric as the first buried insulator layer 12, or it may be comprised of a dielectric that is different from the first buried insulator layer 12. In a preferred embodiment, the second buried insulator layer 32 is an oxide.

The second semiconductor layer 34 is comprised of any semiconducting material which may be the same or different from that of the first semiconductor layer 14. Thus, second semiconductor layer 34 may include, for example, Si, SiC, SiGe, SiGeC, Ge alloys, GaAs, InAs, InP as well as other III/N or II/VI compound semiconductors. The second semiconductor layer 34 may be strained or unstrained and it may be a homogeneous or heterogenous structure. Second semiconductor layer 34 may also comprise a combination of strained and unstrained layers.

The second semiconductor layer 34 may have a crystallographic orientation which is the same or different from that of the first semiconductor layer 14. In one preferred embodiment of the present invention, it is preferred that the second semiconductor layer 34 has a different crystal orientation than the first semiconductor layer 14. This embodiment of the present invention allows for fabricating MOSFETs such as pFETs and nFETs on a crystallographic orientation that provides optimal performance for each type of device; nFETs have an optimal performance when fabricated on a (100) crystallographic surface, while pFETs have an optimal performance when fabricated on a (110) crystallographic surface.

The thickness of the second semiconductor layer 34 may vary depending on the initial starting wafers used to form the structure 102. Typically, however, the second semiconductor layer 34 has a thickness from about 2 nm to about 300 nm, with a thickness from about 5 to about 150 nm being more highly preferred.

Figure 3B:
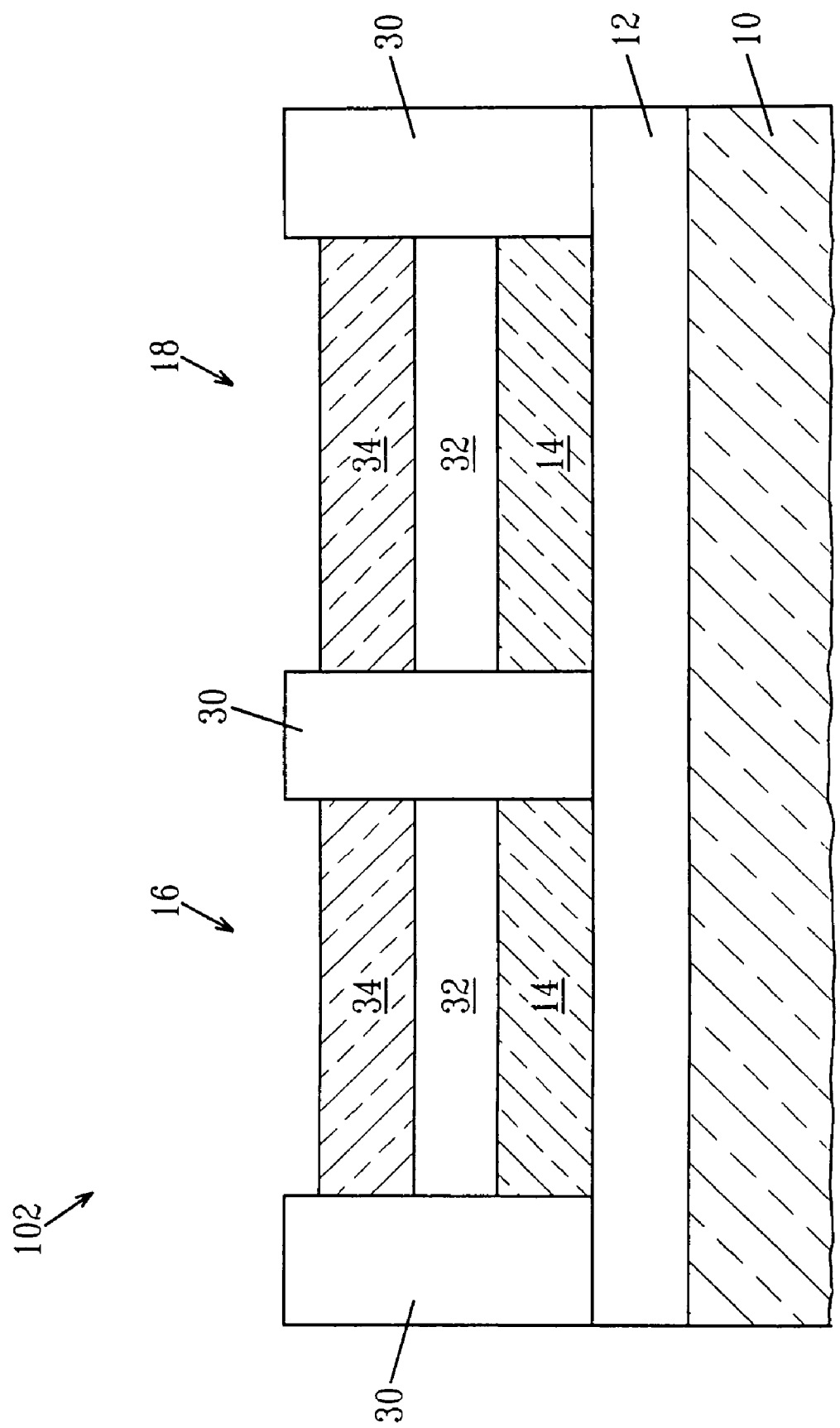

After providing the structure shown in FIG. 3A, isolation regions 30 are formed into the initial structure 102 so as to form the structure shown, for example, in FIG. 3B. As illustrated, the isolation regions 30 typically extend from the upper surface of structure 102 through the second semiconductor layer 34, the second buried insulator layer 32 and the first semiconductor layer 14 stopping on top of, or within, the first buried insulator layer 12. The isolation regions 30 are used to provide device isolation between various device regions. In FIG. 3B, the isolation regions 30 provide isolation between an area for a recessed device region 18 to be subsequently formed and an area for an elevated device region 16.

The isolation regions 30 are formed utilizing conventional trench isolation techniques well known to those skilled in the art. The trench isolation techniques include first forming a trench opening in the structure 102 by lithography and etching, and then filling the trench opening with a trench dielectric such as a high-density oxide or tetraethylorthosilicate. Following trench fill, the trench dielectric may optionally be planarized and/or densified. FIG. 3B shows a trench isolation region that has an upper surface that extends slightly above the upper surface of the second semiconductor layer 34. The extended nub portions of the isolation regions 30 are formed by deposited dielectric material such as oxide, nitride, oxynitride, etc.

Figure 3C:
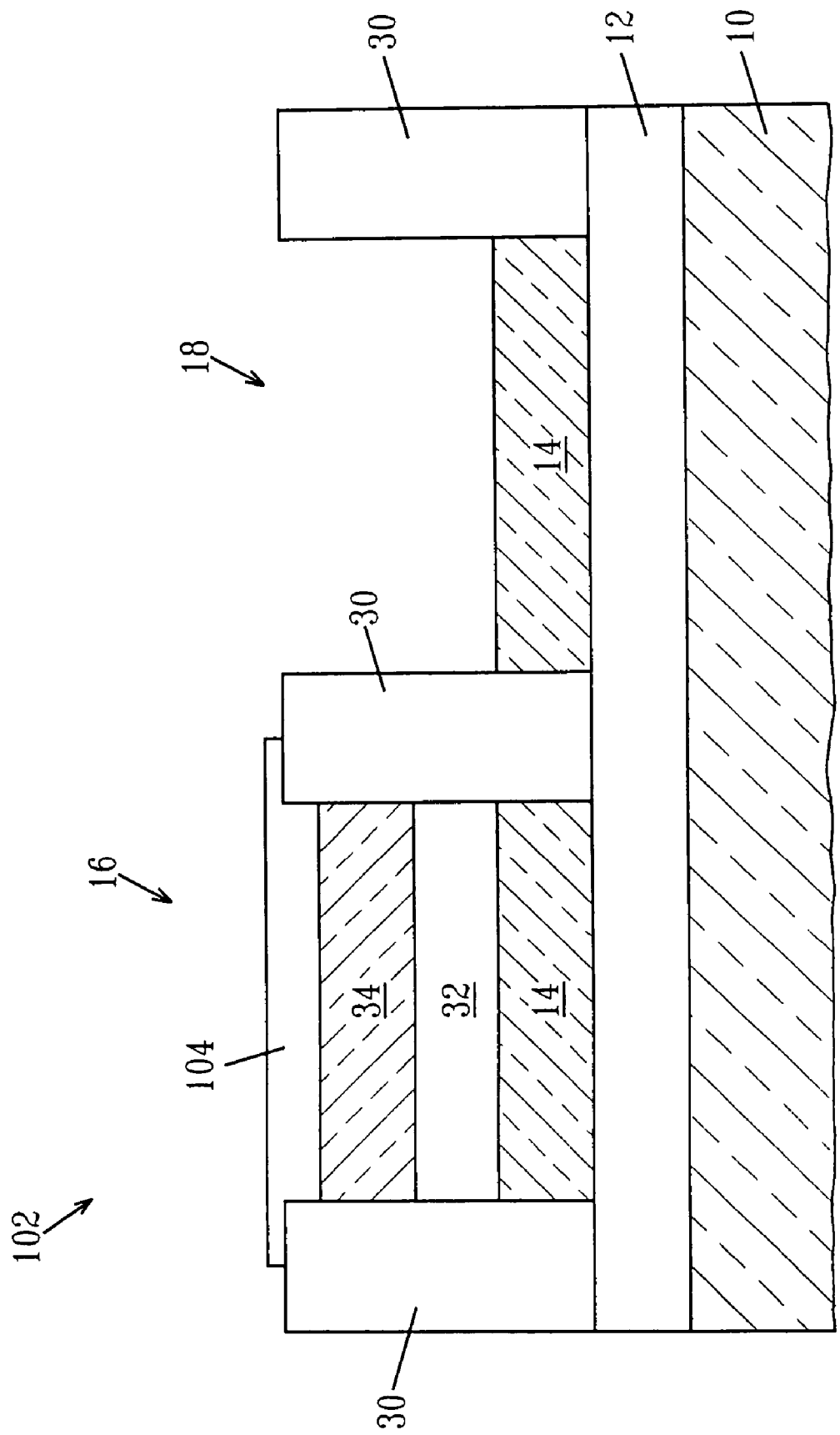

Next, and as illustrated in FIG. 3C, an etch mask 104 is formed atop the second semiconductor layer 34 in which the elevated devices will be subsequently formed. The etch mask 104 is formed by deposition, lithography and etching. The etch mask 104 can be comprised of a nitride. The exposed second semiconductor layer 34 and the underlying second buried insulator layer 32 in the recessed device region 18 are then etched stopping atop a surface of the first semiconductor layer 14. After this recessing step in the device area 18, the etch mask 104 is removed from the structure utilizing a conventional stripping process well known to those skilled in the art that selectively removes nitride.

MOSFET devices such as pFETs and/or nFETs are then formed on the exposed semiconductor layers, i.e., the second semiconductor layer 34 in the elevated device region 16, or the first semiconductor layer 14 in the recessed device region 18. The devices formed in each of the device regions can be the same or different. The type of device formed is dependent on the crystallographic surface orientation of the semiconductor layers, e.g., layers 14 or 34. For example, nFETs are typically formed when the semiconductor layer has a (100), or a (111) crystallographic orientation, while pFETs are typically formed when the semiconductor has a (110), or a (111) crystallographic orientation.

Figure 3D:
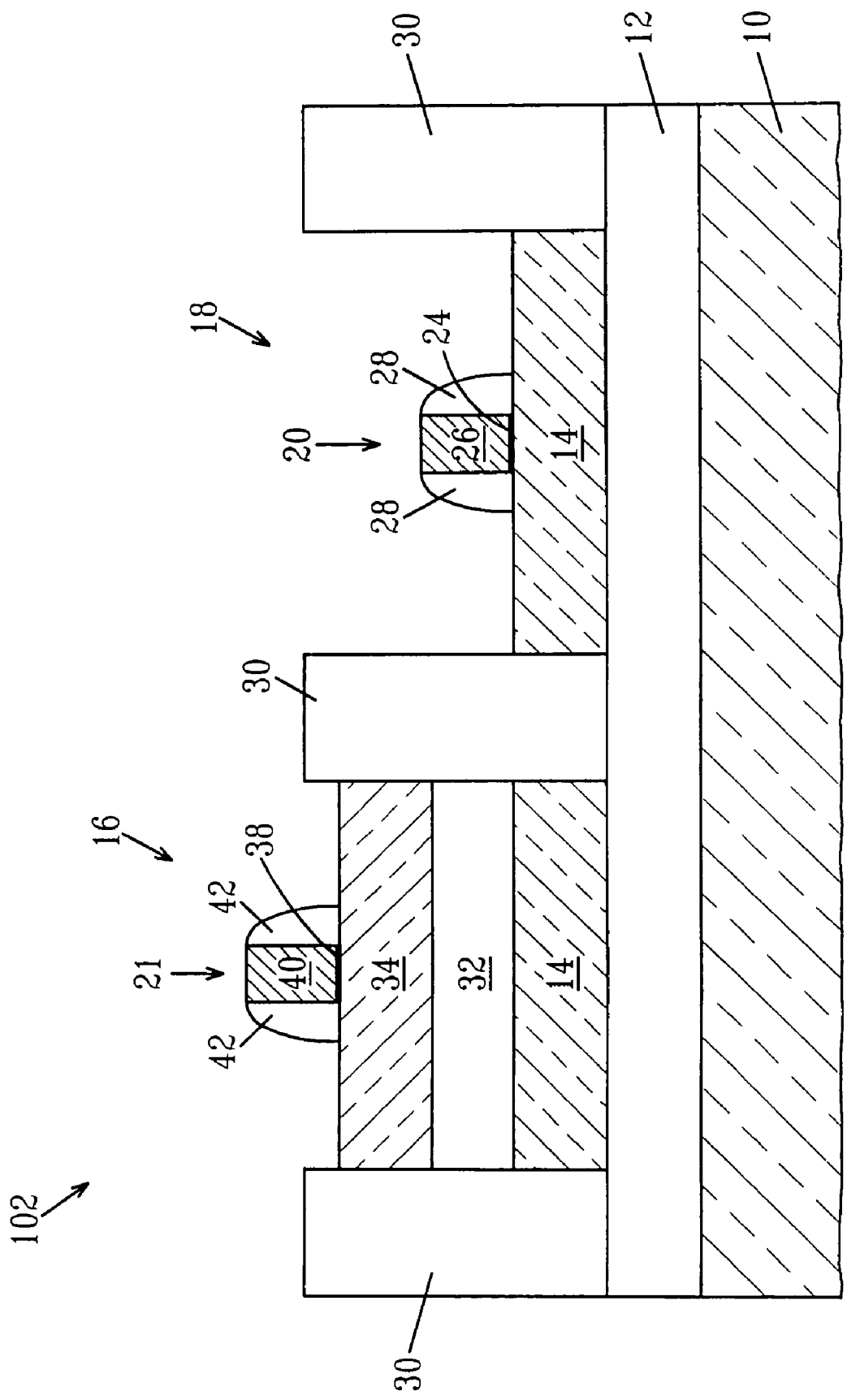

Each device includes a gate dielectric 24, 38, a gate conductor 26, 40, and spacers 28, 42. The devices are fabricated using conventional complementary metal oxide semiconductor processing steps that are well known to those skilled in the art. The CMOS processing steps include deposition or thermal growing of a gate dielectric 24, 38, deposition of a gate conductor 26, 40 and patterning the gate conductor. FIG. 3D shows the resultant structure including devices 20, 21 formed in each of the device regions.

In the drawings, both the gate conductor 26, 40 and the gate dielectric 24, 38 are shown to be patterned. The patterning is achieved by lithography and etching. Following the patterning step, spacers 28, 42 are formed on at least the exposed sidewalls of the gate conductor 26, 40 by deposition and etching. Prior to spacer formation, extension and optionally halo regions may be formed into the exposed semiconductor layers 14, 34 by implantation and annealing. The extension and optional halo regions are not shown in the drawings of the present invention.

Each of the devices 20, 21 may be composed of the same or different material. For example, gate dielectric 24, 38 may be comprised of an oxide, nitride, oxynitride or any combination thereof. The gate conductor 26, 40 comprises a conductive elemental metal, a conductive metal alloy, a conductive silicide, a conductive nitride, polysilicon or any combination thereof. The spacers 28, 42 may be comprised of an oxide, nitride, oxynitride or any combination thereof.

The devices 20, 21 in the elevated device region 16 and the recessed device region 18 may be formed at the same time, or the devices may be built at different times. It should be noted that it is possible to form a structure having a plurality of elevated device regions and recessed device regions utilizing the method described herein. Also, each device region may include a plurality of devices in each of the regions.

Figure 3E:
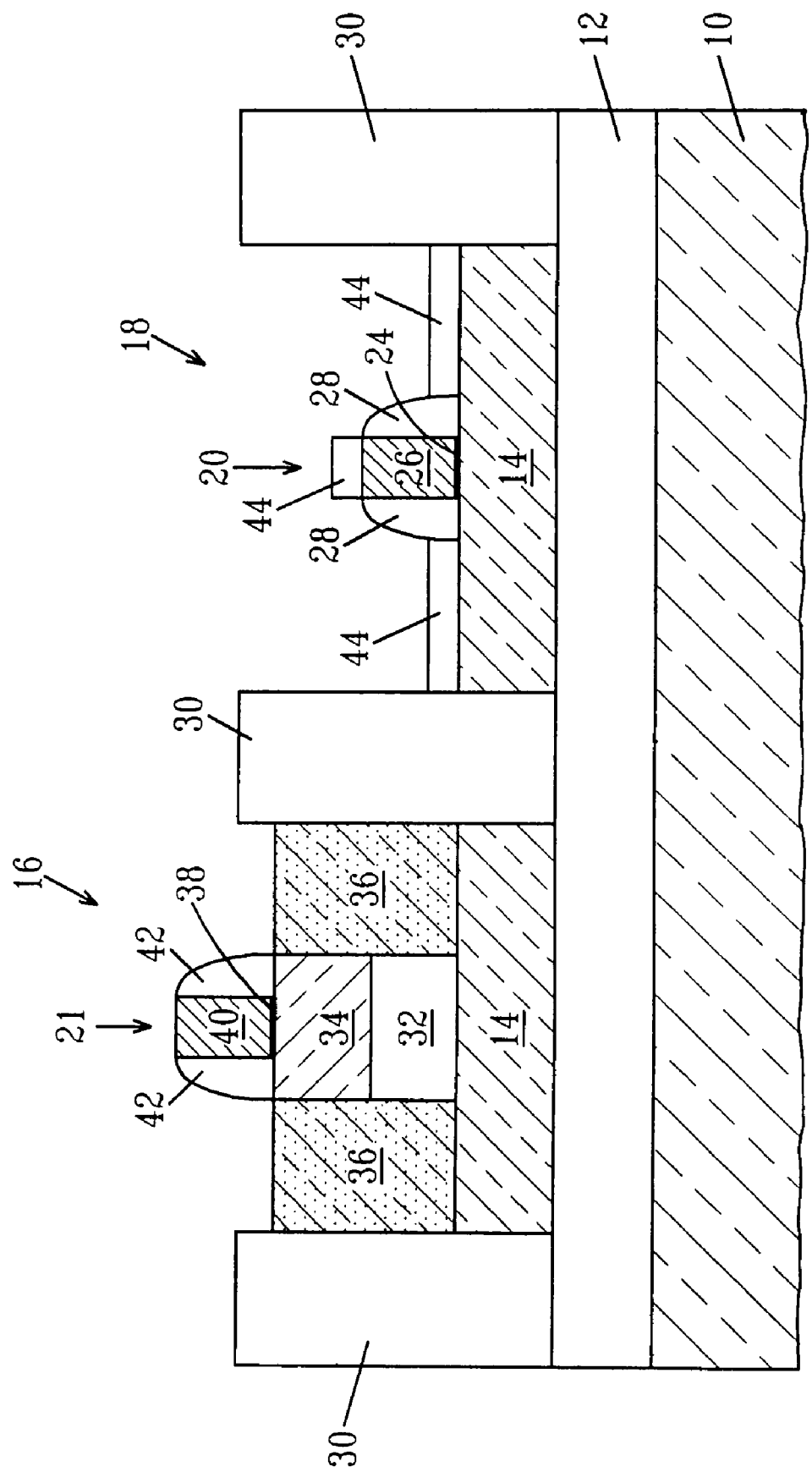

After forming the devices 20, 21 on the elevated device region 16 and the recessed device region 18, an epi mask layer is formed atop the entire structure utilizing an epitaxial growth process. The epi mask layer may comprise an oxide, nitride, oxynitride or any combination thereof, including multilayers. Preferably, the epi mask layer is comprised of an oxide. The epi mask layer is then patterned by lithography and etching so as to protect the recessed device active area. The structure including the deposited, patterned and etched epi mask layer is shown, for example, in FIG. 3E. In FIG. 3E, reference numeral 44 denotes the epi mask layer. As shown, the epi mask layer is located atop exposed surfaces of the gate conductor 26 as well as the exposed surfaces of the first semiconductor layer 14.

The exposed second semiconductor layer 34 and the underlying second buried insulator layer 32 in the elevated device region 16 are now selectively etched stopping on a surface of the first semiconductor layer 14. After the selective etching process, a conductive material such as polysilicon is deposited, followed by a combination of chemical mechanical polishing and recessing. In the embodiment shown, the isolation regions 30 and the spacers 42 in the elevated device region 16 both serve as etch masks. Thus, the area etched will be self-aligned with the isolation regions on one side and the spacers 42 on the other side. The conductive filled area serves as the merged S/D regions 36 in the elevated device region 16; See FIG. 3E.

In another embodiment, not shown, a separate mask is used such that the etched area and the conductive filled region are not self-aligned with the isolation regions and the spacers. This embodiment of the present invention provides the structure shown in FIG. 2.

After forming the merged S/D regions 36, which may or may not be self-aligned with the isolation regions and the spacers, the epi mask layer 44 is removed from the structure utilizing a conventional stripping process that selectively removes oxide or nitride.

Next, source/drain junctions 22, 35 are formed into the elevated device region 16 and the recessed device region 18 at this point of the present invention. The junctions 22, 35 are formed by ion implantation and annealing. As shown, the junctions 35 in the elevated device region 16 are located in portions of the second semiconductor layer 34, portions of the second buried oxide 32 and the first semiconductor layer 14. In regard to the source/drain junctions 22 in the recessed device region 18, the junctions 22 are located only in the first semiconductor layer 14. The implant and anneal conditions may vary depending on the exact materials and thickness of each layer present in the structure. This step provides the structure shown in FIG. 1 or FIG. 2.

After providing the structure shown in FIG. 1 or 2 further CMOS processing steps including interconnect formation can be employed to device completion.

Figure 4A:
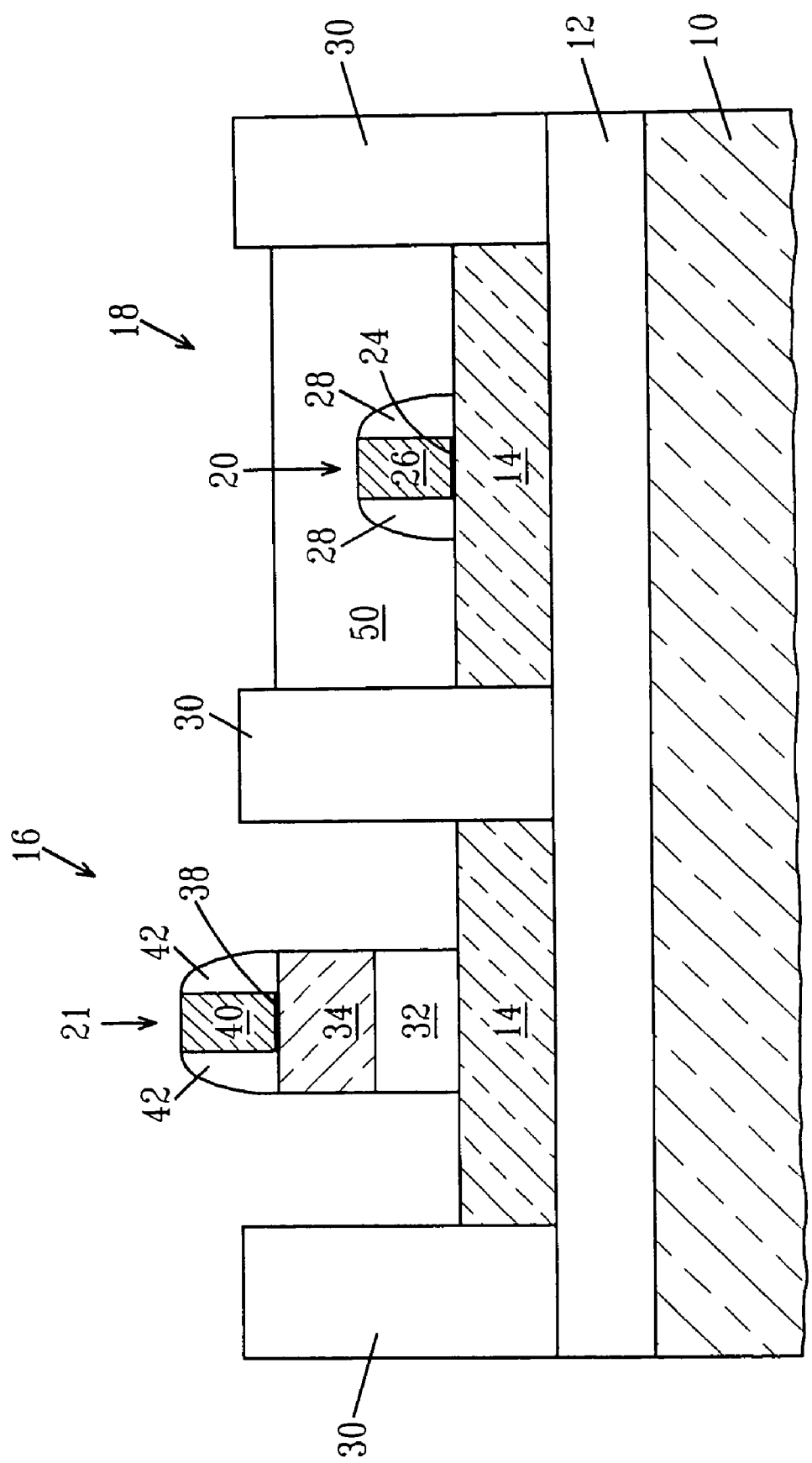
FIGS. 4A–4D are pictorial representations (through cross sectional views) illustrating an alternative embodiment of the present invention.
Figure 4B:
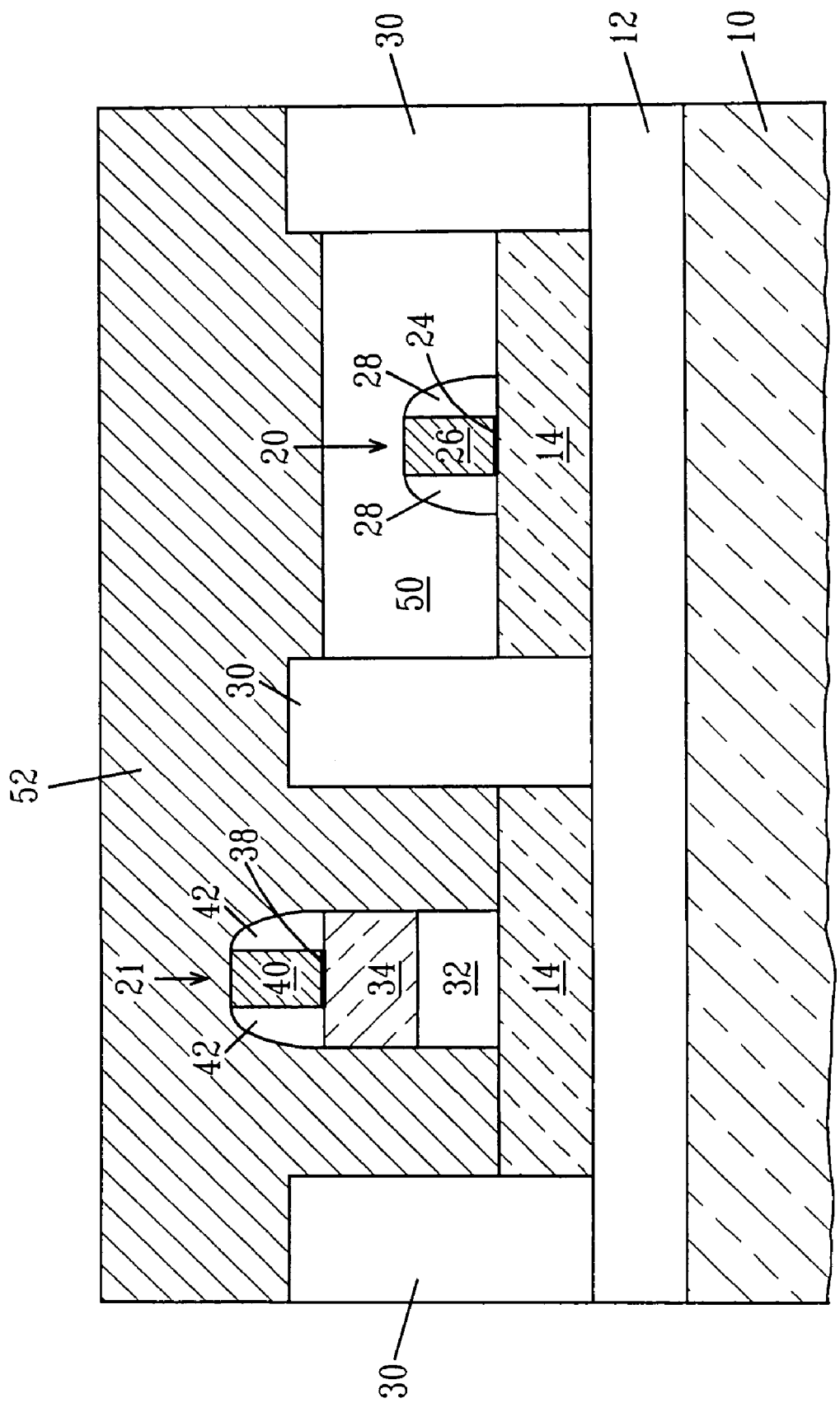

As an alternative to the method depicted in FIGS. 3A–3E, the embodiment depicted in FIGS. 4A–4D may be performed. In this alternative embodiment, the structure shown in FIG. 3D is first provided using the processing steps mentioned above. Next, and as shown in FIG. 4A, a sacrificial layer composed of an oxide or nitride, for example, is applied to the entire structure shown in FIG. 3D and then lithography and etching are used to provide a patterned sacrificial mask 50 atop the recessed device region 18. The sacrificial layer is formed utilizing a conventional deposition process such as chemical vapor deposition (CVD), plasma-enhanced chemical vapor deposition (PECVD), chemical solution deposition, physical vapor deposition and the like. The etching used in forming the patterned sacrificial mask 50 is carried out using reactive ion etching or wet chemical etching or another similar technique.

Conductive material 52 is then deposited via a conventional deposition process atop the structure shown in FIG. 4A. The conductive material 52 is composed of polysilicon, epitaxial Si, metal or another like conductor. The resultant structure including the conductive material 52 is shown, for example, in FIG. 4B.

Next, the conductive material 52 is recessed down to the patterned sacrificial mask 50 by utilizing a combination of chemical mechanical polishing (CMP) and etching. This step of the present invention forms the merged source/drain regions 36 into the elevated device region 16; See FIG. 4C.

Figure 4C:
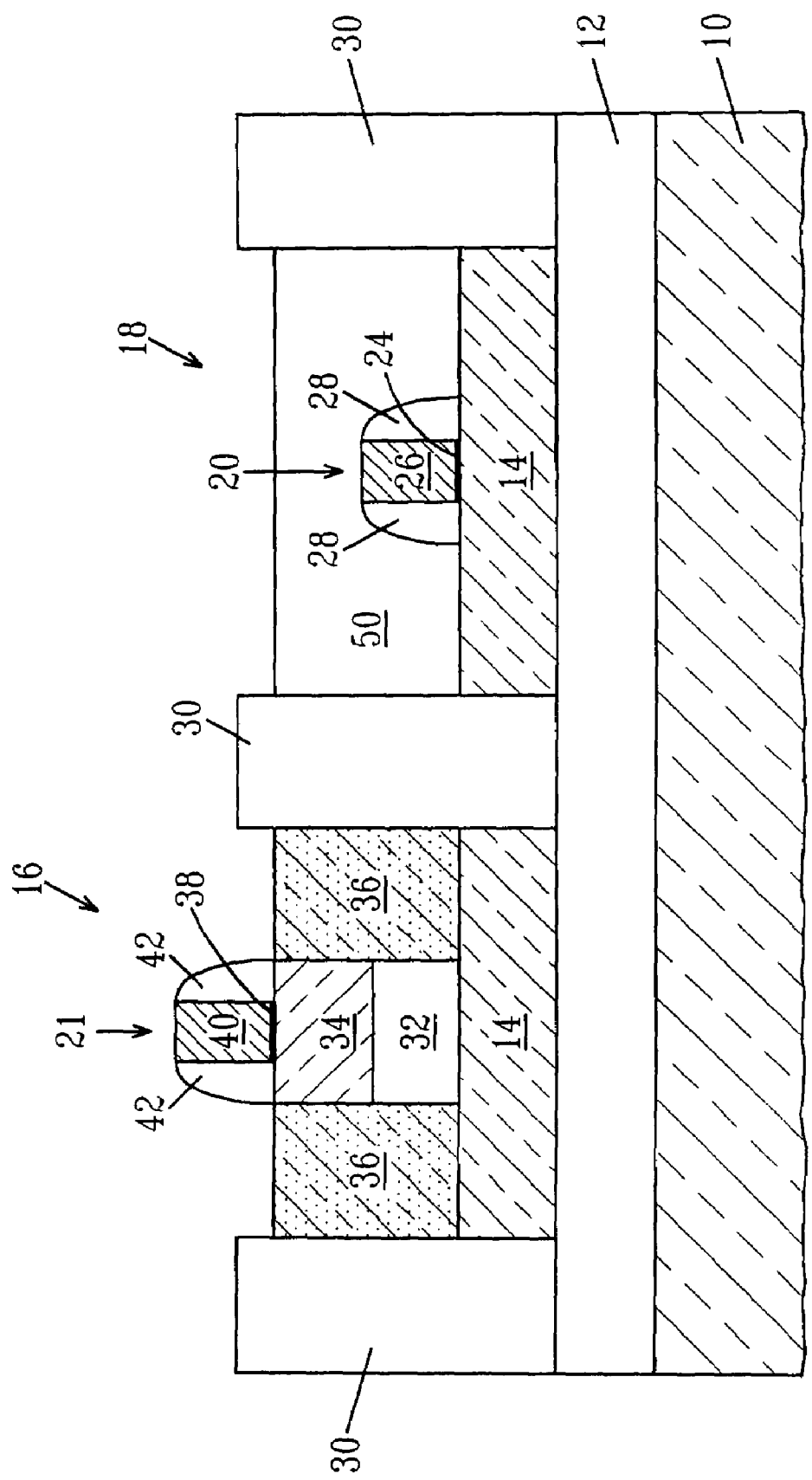
Figure 4D:
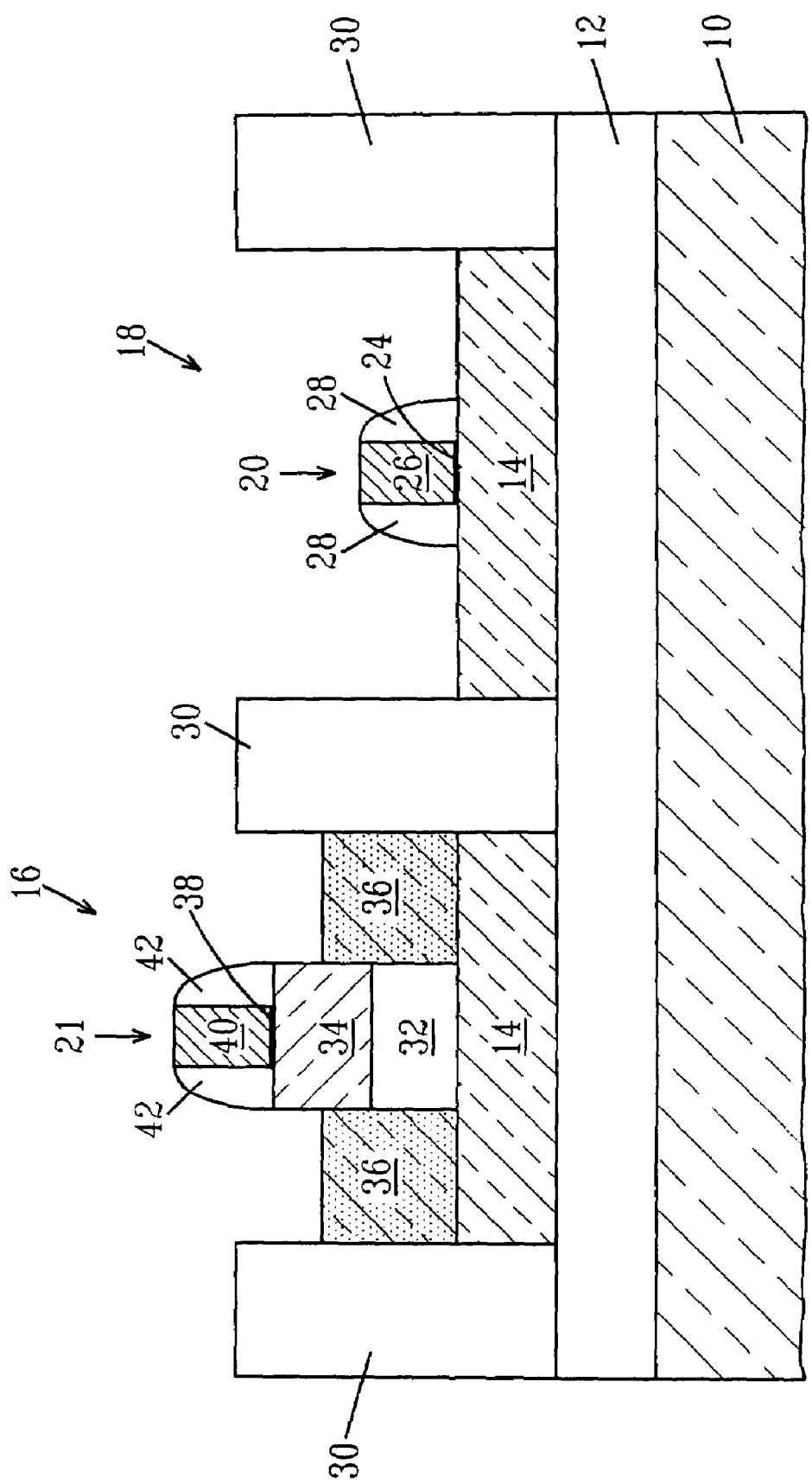

After providing the structure shown in FIG. 4C, the patterned sacrificial mask 50 is removed from the recessed device region 18 utilizing an etching process that selectively removes the sacrificial material from the structure. The resultant structure formed after removal of the patterned sacrificial mask 50 from the recessed device region 18 is shown, for example, in FIG. 4D. Next, the processing steps as mentioned above in connection with FIG. 3E are performed providing the final structure shown in FIG. 1. Alternatively, the processing steps mentioned above in forming the non self-aligned merged source/drain regions can also be now performed to provide the structure shown in FIG. 2.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A silicon-on-insulator (SOI) metal oxide field effect transistor (MOSFET) structure comprising:
   an elevated device region having at least one semiconductor device located on a second semiconductor layer, wherein said elevated device region further comprises a source/drain junction which extends through the second semiconductor layer to an underlying first buried insulator layer, said first buried insulator is separated from the second semiconductor layer by a first semiconductor layer and a second buried insulator layer;
   a recessed device region having at least one semiconductor device located atop said first semiconductor layer which is located on an upper surface of the first buried insulator; and
   an isolation region laterally separating said elevated device region from said recessed device region.

2. The SOI MOSFET structure of claim 1 wherein the elevated device region further comprises a merged source/drain region that is self-aligned to an edge of the isolation region and a spacer of the one isolation region located in the elevated device region.

3. The SOI MOSFET structure of claim 1 wherein the elevated device region further comprises a merged source/drain region that is not self-aligned to an edge of the isolation region and a spacer of the one semiconductor device located in the elevated device region.

4. The SOI MOSFET of claim 1 wherein the first semiconductor layer and the second semiconductor layer comprise the same or different semiconductor material selected from the group consisting of Si, SiC, SiGe, SiGeC, Ge alloys, GaAs, InAs, InP, and other III/V or II/VI compound semiconductors.

5. The SOI MOSFET of claim 4 wherein the first and the second semiconductor layers are strained, unstrained, or a combination of strained and unstrained.

6. The SOI MOSFET of claim 4 wherein the first and second semiconductor layers are homogeneous or heterogeneous layers.

7. The SOI MOSFET of claim 4 wherein the first and second semiconductor layers have the same or different crystallographic orientation.

8. The SOI MOSFET of claim 1 wherein the first semiconductor layer has a (100) crystallographic orientation and a device located thereon is an nFET, and the second semiconductor layer has a (110) crystallographic orientation and a device located thereon is a pFET.

9. The SOI MOSFET of claim 1 wherein the first semiconductor layer has a (110) crystallographic orientation and a device located thereon is a pFET, and the second semiconductor layer has a (100) crystallographic orientation and a device located thereon is an nFET.

* * * * *

UNITED STATES PATENT AND TRADEMARK OFFICE
CERTIFICATE OF CORRECTION

PATENT NO.       : 7,034,362 B2
APPLICATION NO.  : 10/688692
DATED            : April 25, 2006
INVENTOR(S)      : Kern Rim It is certified that error appears in the above-identified patent and that said Letters Patent is hereby corrected as shown below:

<u>Column 9 Line 35-36, Claim 2:</u>
"and a spacer of the one isolation region located in the elevated device region"

should read

--and a spacer of the one semiconductor device located in the elevated device region--

Signed and Sealed this

Seventeenth Day of October, 2006

JON W. DUDAS
*Director of the United States Patent and Trademark Office*